US011237482B2

(12) United States Patent
Chang et al.

(10) Patent No.: US 11,237,482 B2
(45) Date of Patent: Feb. 1, 2022

(54) PROCESS SYSTEM AND OPERATING METHOD THEREOF

(71) Applicant: TAIWAN SEMICONDUCTOR MANUFACTURING CO., LTD., Hsinchu (TW)

(72) Inventors: Chao-Chen Chang, Taipei (TW); Shao-Wei Luo, Taipei (TW); Jen-Yang Chung, Penghu County (TW); Shang-Chieh Chien, New Taipei (TW); Li-Jui Chen, Hsinchu (TW); Po-Chung Cheng, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/195,945

(22) Filed: Nov. 20, 2018

(65) Prior Publication Data

US 2020/0057381 A1    Feb. 20, 2020

Related U.S. Application Data

(60) Provisional application No. 62/718,397, filed on Aug. 14, 2018.

(51) Int. Cl.
*G03F 7/20* (2006.01)
*H05G 2/00* (2006.01)

(52) U.S. Cl.
CPC ......... *G03F 7/70033* (2013.01); *H05G 2/003* (2013.01); *H05G 2/008* (2013.01)

(58) Field of Classification Search
CPC . G03F 7/70483; G03F 7/70033; H05G 2/008; H05G 2/003
See application file for complete search history.

(56) References Cited

U.S. PATENT DOCUMENTS

| | | | |
|---|---|---|---|
| 8,445,876 B2* | 5/2013 | Suganuma | G03F 7/70141 250/504 R |
| 9,338,870 B2* | 5/2016 | Tao | H05G 2/008 |
| 9,625,824 B2* | 4/2017 | Lu | H05G 2/00 |
| 2010/0090133 A1* | 4/2010 | Endo | H05G 2/00 250/504 R |

(Continued)

OTHER PUBLICATIONS

Fujioka, Shinsuke, et al. "Pure-tin microdroplets irradiated with double laser pulses for efficient and minimum-mass extreme-ultraviolet light source production." Applied Physics Letters 92.24 (2008): 241502 (Year: 2008).*

*Primary Examiner* — Wyatt A Stoffa
(74) *Attorney, Agent, or Firm* — McClure, Qualey & Rodack, LLP

(57) ABSTRACT

A device is disclosed that includes a master controller, a process chamber, a local controller, a switch, and a data storage. The process chamber is configured to generate a data according to a EUV light generation process. The local controller is coupled to the master controller and configured to control the process chamber. The switch is coupled between the master controller and the local controller, wherein the switch is configured to provide paths for the local controller to communicate with the master controller. The data storage directly connected to the local controller and configured to store the data. The local controller communicates directly with the data storage.

20 Claims, 4 Drawing Sheets

(56) References Cited

U.S. PATENT DOCUMENTS

| | | | |
|---|---|---|---|
| 2010/0140512 A1* | 6/2010 | Suganuma | G03F 7/70033 250/504 R |
| 2012/0161040 A1* | 6/2012 | Endo | G21K 5/00 250/504 R |
| 2015/0083936 A1* | 3/2015 | Wehrens | H05G 2/008 250/504 R |
| 2016/0037616 A1* | 2/2016 | Saito | H05G 2/005 250/504 R |
| 2016/0320708 A1* | 11/2016 | Lu | H05G 2/005 |
| 2017/0084360 A1* | 3/2017 | Senekerimyan | G01J 1/42 |
| 2017/0373461 A1* | 12/2017 | Nogiwa | H01S 3/2375 |
| 2018/0139831 A1* | 5/2018 | Riggs | H05G 2/008 |
| 2018/0173102 A1* | 6/2018 | Yabu | H05G 2/006 |
| 2018/0288863 A1* | 10/2018 | Fujimaki | H05G 2/006 |
| 2018/0373141 A1* | 12/2018 | Brouns | G03F 7/70741 |
| 2018/0373162 A1* | 12/2018 | Slotboom | G03F 7/70525 |
| 2018/0375283 A1* | 12/2018 | Kurosawa | G03F 7/70025 |
| 2019/0072857 A1* | 3/2019 | Kupers | G03F 7/70525 |
| 2019/0075642 A1* | 3/2019 | Hori | H05G 2/006 |
| 2019/0159327 A1* | 5/2019 | Yanagida | H05G 2/005 |
| 2019/0243257 A1* | 8/2019 | Guan | G03F 7/708 |
| 2019/0254152 A1* | 8/2019 | Riggs | H05G 2/008 |

\* cited by examiner

PROCESS SYSTEM AND OPERATING METHOD THEREOF

CROSS REFERENCE TO RELATED APPLICATION

This application claims priority to U.S. Provisional Application Ser. No. 62/718,397, filed Aug. 14, 2018, which is herein incorporated by reference.

BACKGROUND

Lithography is widely recognized as a key process in manufacturing integrated circuits (ICs) as well as other devices and/or structures. A lithographic apparatus is a machine, used during lithography, which applies a desired pattern onto a substrate. Even small defects or irregularities in a pattern on a patterned device would lead to large problems with devices formed on a substrate. Typically, pattern defect detection systems are available for illumination. Modern semiconductor lithography uses much lower wavelengths of the illumination in order to obtain smaller circuit feature dimensions used in semiconductor circuits. Extreme ultra-violet (EUV) sources provide suitable illumination, with sources producing wavelengths as small as required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
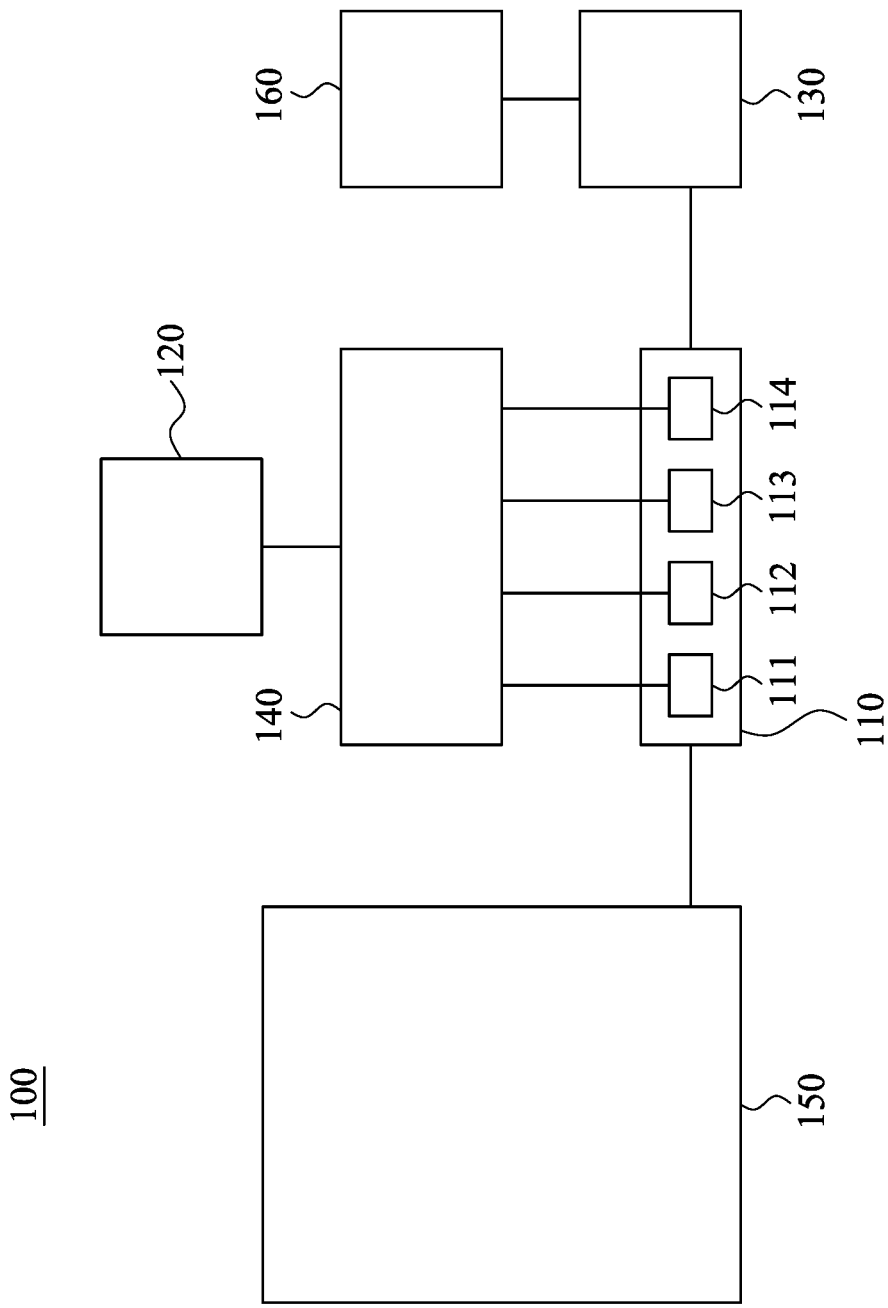
FIG. 1 is a schematic diagram of a process system, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

Reference is made to FIG. 1. FIG. 1 is a schematic diagram of a process system 100, according to some embodiments of the present disclosure. The process system 100 includes a local controller 110, a master controller 120, a data storage 130, a switch 140, and a process chamber 150.

For illustration in FIG. 1, the master controller 120 is coupled to the switch 140. The switch 140 is coupled between the master controller 120 and the local controller 110. The process chamber 150 is coupled to the local controller 110. The data storage 130 is coupled to the local controller 110.

In some embodiments, the master controller 120 is configured to control the local controller 110 through the switch 140. For illustration, the master controller 120 sends commands through the switch 140 to the local controller 110, such that the local controller 110 performs operations in response to the commands.

In some embodiments, the local controller 110 is configured to control the process chamber 150, for illustration, in response to the commands from the master controller 120. In some embodiments, the local controller 110 includes sub local controllers 111-114. The sub local controllers 111-114 are configured to control the process chamber 150 to perform corresponding operations. For illustration in FIG. 1, each one of the sub local controllers 111-114 is coupled between the master controller 120 and the process chamber 150, and receives corresponding commands from the master controller 120 and controls the process chamber 150 to perform corresponding operations accordingly.

In some embodiments, the switch 140 provides paths for sub local controllers 111-114 to communicate with the master controller 120. Each path has a bandwidth of, for example, 50 kHz or 50 bps, for data transmission.

In some embodiments, the sub local controller 111 is configured to perform laser and droplet feedback control of the process chamber 150. In some other embodiments, the sub local controller 111 is configured to perform timing and energy control of the process chamber 150. In some embodiments, the sub local controllers 112-113 are configured to control the process chamber 150 to perform target formation metrology. In some embodiments, the sub local controller 114 is configured to control the process chamber 150 to perform final focus metrology. The functions of the sub local controllers 111-114 described above are given for illustrative purposes. Various functions of the sub local controllers are within the contemplated scope of the present disclosure.

In some embodiments, the process chamber 150 is configured to perform fabrication of semiconductor devices. For illustration, the process chamber 150 generates light within an extreme ultraviolet (EUV) range. In some other embodiments, the process chamber 150 is further configured to perform a lithography process on a substrate with a mask by the EUV light. The process performed by the process chamber 150, as stated above, is given for illustrative purposes. Various processes that the process chamber 150 is able to perform are within the contemplated scope of the present disclosure. For example, the light generated by the process chamber 150 is used to etch a material layer on a substrate.

In some embodiments, during operations of the process chamber 150, the process chamber 150 is configured to generate data that is associated with, for illustration, performing the lithography process using the EUV light, as discussed above. The data is transmitted by the process chamber 150 to the local controller 110, the sub local controllers 111-114, or the combination thereof. More details of the operations of the process chamber 150 will be discussed below with reference to FIG. 2.

In some embodiments, the local controller 110 is configured to transmit the data to the data storage 130. The data storage 130 is configured to receive the data transmitted from the local controller 110. The data storage 130 is further configured to store the data received from the local controller 110. Alternatively stated, the local controller 110 is configured to write the data into the data storage 130. In some other embodiments, the local controller 110 is configured to access the data stored in the data storage 130. The data storage 130 is configured to send the data to the local controller 110. Alternatively stated, the local controller 110 is configured to read the data stored in the data storage 130.

For illustration in FIG. 1, the local controller 110 is directly or indirectly coupled to the data storage 130. The communication between the local controller 110 and the data storage 130 is performed without the switch 140. Alternatively stated, the data transmission between the local controller 110 and the data storage 130 is independent from the switch 140. For illustration, when the local controller 110 writes data into the data storage 130, the data is transmitted from the local controller 110 to the data storage 130 without passing through the switch 140. Accordingly, the bandwidth for the data transmission of the switch 140 is not occupied by the write operation of the local controller 110. For another illustration, when the local controller 110 reads the data from the data storage 130, the data is transmitted from the data storage 130 to the local controller 110 without passing through the switch 140. Accordingly, the bandwidth for the data transmission of the switch 140 is not occupied by the read operation of the local controller 110. With the data storage 130 being coupled to the local controller 110 without the switch 140 therebetween, the transmission of data including, for example, high frequency data, between the data storage 130 and the local controller 110 is not limited by the transmission bandwidth of the switch 140. In some embodiments, the high frequency is defined as the frequency higher than 50 kHz. Furthermore, during operations, the switch 140 does not suffer communication error generated when the switch 140 transmits high frequency data and is able to function normally, compared to some approaches that the local controller 110 receives or transmits data through the switch 140, from or to the data storage 130.

In some embodiments, the process system 100 further includes a data analyzing tool 160. For illustration in FIG. 1, the data analyzing tool 160 is connected to the data storage 130. The data analyzing tool 160 is configured to analyze the data stored in the data storage 130 when the local controller 110 is operated. In some embodiments, the data analyzing tool 160 is configured to perform automatic droplet optimization, real time plotting, hybrid waveform optimization, or the combination thereof, to the data received from the data storage 130. In some embodiments, the data analyzing tool 160 is implemented by a processor or a computer. The above functions of the data analyzing tool 160 are given for illustrative purposes. Various functions of the data analyzing tool 160 are within the contemplated scope of the present disclosure.

Figure 2:
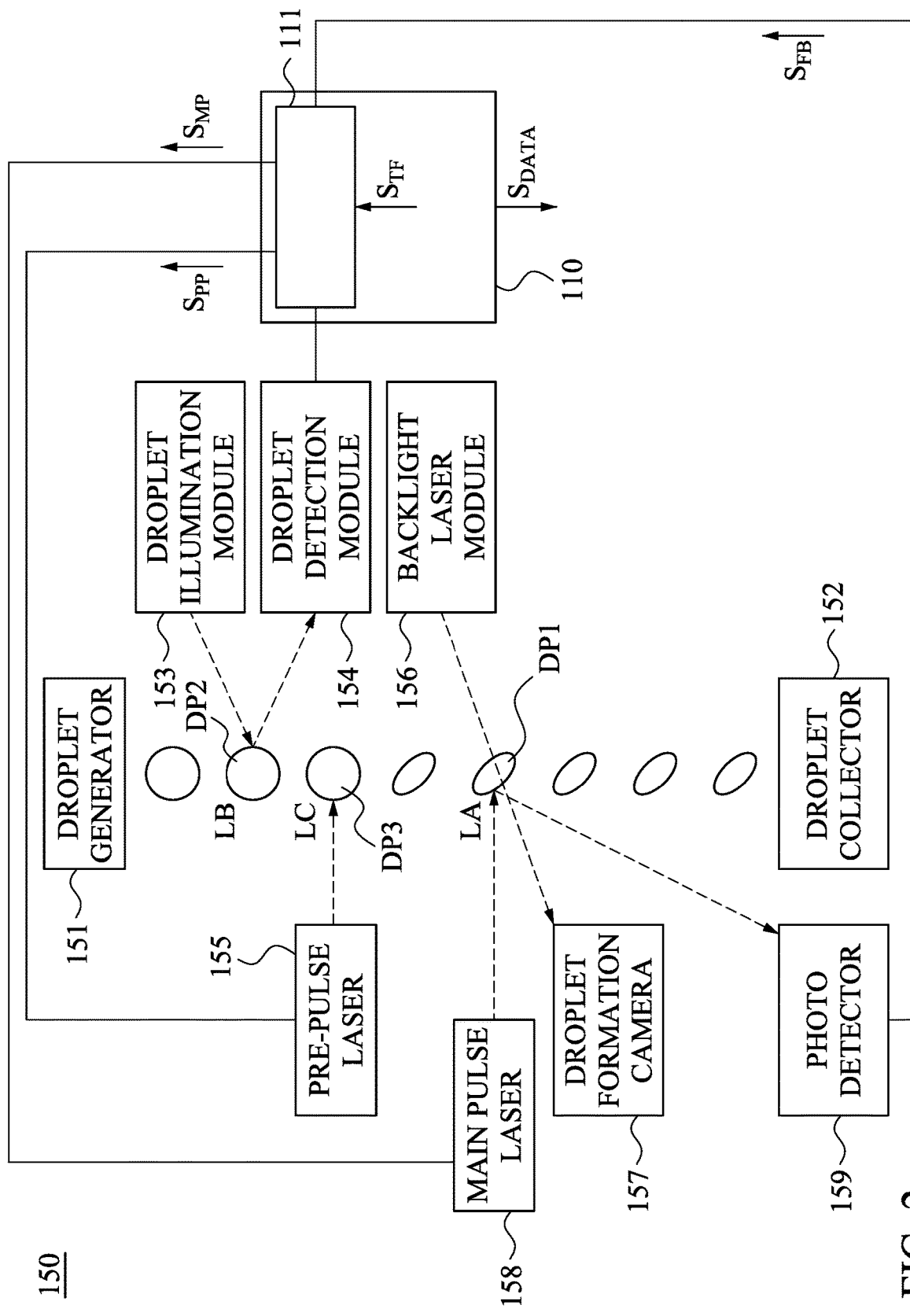
FIG. 2 is a schematic diagram of a process chamber of the process system in FIG. 1, according to some embodiments of the present disclosure.

Reference is made to FIG. 2. FIG. 2 is a schematic diagram of the process chamber 150 as illustrated in FIG. 1, according to some embodiments of the present disclosure. The process chamber 150 includes a droplet generator 151, a droplet collector 152, a droplet illumination module 153, a droplet detection module 154, a pre-pulse laser 155, a backlight laser module 156, a droplet formation camera 157, a main pulse laser 158, and a photo detector 159.

In some embodiments, the droplet generator 151 is configured to generate a target droplet DP1 released to a desired location LA. In some embodiments of the present disclosure, the target droplets are formed of tin (Sn). Alternatively stated, the target droplets are tin droplets. The droplet generator 151 is operated in response to a signal from the master controller 120. In some other embodiments, the droplet generator 151 includes a delivery control system (not shown) and a delivery mechanism (not shown) both configured to modify the release point of the droplets to correct for errors in the droplets arriving at the location LA.

In some embodiments, the target droplet DP1 is released toward the droplet collector 152. For illustration in FIG. 2, the target droplets are generated and released from the droplet generator 151 to the droplet collector 152 through the location LA. In some embodiments, the droplet generator 151 generates the target droplets periodically, for example, at a frequency of 50 kHz. Alternatively stated, the droplet generator 151 generates 50000 droplets every second when it is in operation.

In some embodiments, the droplet illumination module 153 is configured to generate a first light beam to the target droplet DP2 generated by the droplet generator 151 at a location LB. When the target droplet DP2 is irradiated by the first light beam at the location LB, a first flash is generated by the reflection of the first light beam from the droplet DP2.

In some embodiments, the droplet illumination module 153 is further configured to generate a second light beam to the target droplet DP2 generated by the droplet generator 151 at the location LB. In some embodiments, the output power of the second light beam is higher than the output power of the first light beam. When the target droplet DP2 is irradiated by the second light beam at the location LB, a second flash is generated by the reflection of the second light beam from the target droplet DP2.

In some embodiments, the first light beam has a wavelength of about 806 nm and an output power of about 2 watts, and the second light beam has a wavelength of about 1070 nm and an output power of about 5-50 watts. The above values of the output power and the wavelength are given for illustrative purposes. Various values of the wavelength and the output power are within the contemplated scope of the present disclosure. For example, in various embodiments, the droplet illumination module 153 generates a light beam having an output power of miliwatts and a wavelength of about 634 nm.

In some embodiments, the droplet detection module 154 is configured to detect the first flash and the second flash generated by the reflection of the first light beam and the second light beam from the target droplets DP2. For illustration in FIG. 2, when the droplet illumination module 153 generates the first light beam and the second light beam, and when the first light beam and the second light irradiate the target droplet DP2, the first flash and the second flash are generated by the reflection of the light beams from the target droplet DP2. The droplet detection module 154 then detects the flashes generated by the reflection of the light beams from the target droplet DP2.

In some embodiments, based on the detection result of the droplet detection module 154, the droplet detection module 154 is configured to generate a corresponding signal transmitted to the local controller 110. According to the signal transmitted from the droplet detection module 154, the local controller 110 is able to synchronize the process chamber 150 and the sub local controllers 111-114.

In some embodiments, the droplet detection module 154 is further configured to distinguish flashes reflected by the first light beam or the second light beam. In some embodiments, the combination of the first flash and the second flash carry information about the location of the droplets in the process chamber 150. Based on distinguishing the first flash and the second flash, the droplet detection module 154 is configured to generate the corresponding signal which carries the information about the location of the droplets in the process chamber 150.

In some embodiments, the droplet detection module 154 includes a collection lens (not shown), a spatial filter (not shown), a slit aperture (not shown), and a sensor (not shown), which operate together to generate a signal according to the flashes, and an amplifier board (not shown) to boost the signal from the sensor. The droplet detection module 154 transmits the boosted signal to the local controller 110, for the local controller 110 to modify the control of the process chamber 150 accordingly.

In some embodiments, the droplet illumination module 153 and the droplet detecting module 154 are also referred together to as a metrology module. The above configurations of the droplet illumination module 153 and the droplet detection module 154 are given for the illustrative purposes. Various configurations of the droplet illumination module 153 and the droplet detection module 154 are within the contemplated scope of the present disclosure.

In some embodiments, the pre-pulse laser 155 is configured to emit a pre-pulse light beam to deform, for illustration in FIG. 2, the target droplet DP3 at a location LC. In some embodiments, the pre-pulse laser 155 is configured to generate the pre-pulse light beam in a frequency of 50 kHz. In some embodiments, with the synchronization performed by the local controller 110, as discussed above, the local controller 110 generates a pre-pulse signal $S_{PP}$. In response to the pre-pulse signal $S_{PP}$, the pre-pulse laser 155 emits the pre-pulse light beam to hit the target droplet DP3 at the location LC. The pre-pulse light beam is able to deform the target droplet DP3 according to the pre-pulse signal $S_{PP}$ generated from the local controller 110.

In some embodiments, the pre-pulse laser 155 generates the pre-pulse light beam with a wavelength of about 10.2 μm, average output power of about 4 kwatts, pulse energy of about 80 mJ, full width at half maximum (FWHM) of about 200-250 μm, or the combination thereof. The above parameters of the pre-pulse light beam are given for illustrative purposes. Various parameters of the pre-pulse light beam are within the contemplated scope of the present disclosure.

In some embodiments, the process chamber 150 is operated in the dark, and therefore, the backlight laser module 156 is configured to illuminate, for illustration in FIG. 2, the deformed target droplet DP1. The backlight laser module 156 is configured to emit the light which has the spectrum that the droplet formation camera 157 is able to sense. The droplet formation camera 157 is thus configured to detect the deformed target droplet DP1 by the illumination of the backlight laser module 156. In some embodiments, the droplet formation camera 157 is configured to detect statuses and/or features of the droplets, including, for example, a shape of the droplet, a diameter of the droplet, a tilted angle of the droplet, etc. In some embodiments, the droplet formation camera 157 is further configured to generate a signal transmitted to the local controller 110, to indicate if the droplets have been deformed to the desired shape with desired diameter and the desired tilted angle.

In some embodiments, the droplets have a ball shape with a diameter of about 27 μm when the droplets are generated from the droplet generator 151. After the pre-pulse laser 155 deforms the droplets, the droplets have a diameter about 280-320 μm. The above shapes of the droplets are given for illustrative purposes. Various shapes of the droplets are within the contemplated scope of the present disclosure. For example, in various embodiments, the droplets are deformed to a pancake-like shape by the pre-pulse laser 155.

In some embodiments, the main pulse laser 158 is configured to generate a main light beam to strike, for illustration in FIG. 2, the deformed target droplet DP1 at location LA. The deformed target droplet DP1 is excited by the main light beam to be at a plasma state. In some embodiments, the droplets with the plasma state emit light. Alternatively stated, the EUV light is emitted according to a conversion process of the plasma. The light emitted includes light with wavelengths that correspond to the material of the droplets, including EUV light.

In some embodiments, the main pulse laser 158 generates main light beam with a wavelength of about 10.6 μm, average output power of about 15 kwatts, pulse energy of about 300 mJ, and full width at half maximum (FWHM) of about 337-440 μm. The above parameters of the main light beam are given for illustrative purposes. Various parameters of main light beam are within the contemplated scope of the present disclosure.

In some embodiments, the light emitted from the target droplets with plasma state also includes deep ultraviolet (DUV) light, visible light, near infrared (NIR) light, mid-wavelength infrared (MWIR) light, long-wavelength infrared (LWIR) light, or the combination thereof. The EUV light includes light having a wavelength of, for example, 5 nm, 5-20 nm, 10-120 nm, or less than 50 nm. The DUV light includes light having wavelengths, for example, between about 120-200 nm, the visible light includes light having wavelengths, for example, between 390-750 nm, and NIR light includes light having wavelengths, for example, between about 750-2500 nm.

In some embodiments, the local controller 110 is configured to generate main pulse signal $S_{MP}$ transmitted to the main pulse laser 158 according to the signal generated from the droplet formation camera 157. In some embodiments, the local controller 110 is configured to generate a fire signal $S_{TF}$ according to the location information of the droplets. The fire signal $S_{TF}$ is synchronized with the droplet generator 151, the pre-pulse laser 155, and the main pulse laser 158. In some embodiments, the fire signal $S_{TF}$ carries the information of the speed of the droplets. In some embodiments, the pre-pulse signal $S_{PP}$, the main pulse signal $S_{MP}$, and the fire signal $S_{FT}$ are configured to make the pre-pulse laser 155 and the main pulse laser 158 operate in a right sequence and right time. Alternatively stated, the local controller 110 controls the pre-pulse laser 155 to emit the pre-pulse light beam at a time such that the emitted pre-pulse light beam will arrive at the location LC simultaneously with the corresponding droplet, and controls the main pulse laser 158 to emit the main light beam at a time such that the main light beam will arrive at the location LA simultaneously with the corresponding droplet.

In some embodiments, the EUV light emitted from the droplets with the plasma state is configured for a lithography process. The EUV light is focused and directed to substrates, including, for example, silicon wafers, to produce small features thereon. Other suitable substrates are within the contemplated scope of the present disclosure.

In some embodiments, the photo detector 159 is configured to detect the light emitted from the droplets with the plasma state. In some embodiments, the photo detector 159 is configured to measure the EUV light parameters, including but not limited to, pulse energy, spectrum, energy within a particular band of wavelengths, energy outside of a particular band of wavelengths, and angular distribution of EUV light intensity, average power, or the combination thereof. In some embodiments, the photo detector 159 is configured to generate a feedback signal $S_{FB}$ to the local controller 110. The feedback signal $S_{FB}$ indicates, for example, the errors in parameter such as the timing and focus of the pre-pulse light bean and the main light beam to properly intercept the droplets in the right location and time for effective and efficient EUV light production.

In some embodiments, the local controller 110 is configured to generate a data signal $S_{DATA}$ according to the feedback signal $S_{FB}$ received from the photo detector 159. The data signal $S_{DATA}$ is transmitted to the data storage 130. Alternatively stated, the local controller 110 is configured to write the data signal $S_{DATA}$ in the data storage 130.

For illustration in FIG. 2, after the target droplet DP3 are deformed by the pre-pulse light beam at location LC, the target droplet DP3 travels to the location LA as the target droplet DP1. The backlight laser module 156 illuminates the droplets and the droplet formation camera 157 detects the shape and the orientation of droplets. The sub local controller 111 generates and transmits the main pulse signal $S_{MP}$ to main pulse laser 158. The main pulse laser 158 generates the main light beam according the main pulse signal $S_{MP}$ to the target droplet DP1 at location LA. The target droplet DP1 are excited by the main light beam to the plasma state, and the target droplet DP1 emits EVU light according to the plasma state of the material. The photo detector 159 detects the EUV light emitted from the target droplet DP1 and generates the feedback signal $S_{FB}$ to the local controller 110. After the target droplet DP1 is stricken by the main light beam at location LA, the target droplet DP1 travels to the droplet collector 152. The droplet collector 152 collects the droplet.

The above configuration of the process chamber 150 is given for illustrative purposes. Various configurations of the process chamber 150 are within the contemplated scope of the present disclosure. For example, in various embodiments, the process chamber 150 is able to be divided into three parts including a vessel, a lower cone, and an intermediate focus cone. The droplets travel through the vessel of the process chamber 150. The emitted EUV light is directed through the lower cone and the intermediate focus cone. In other various embodiments, the droplet generator 151 and the droplet collector 152 are implemented horizontally with respect to the ground.

Figure 3:
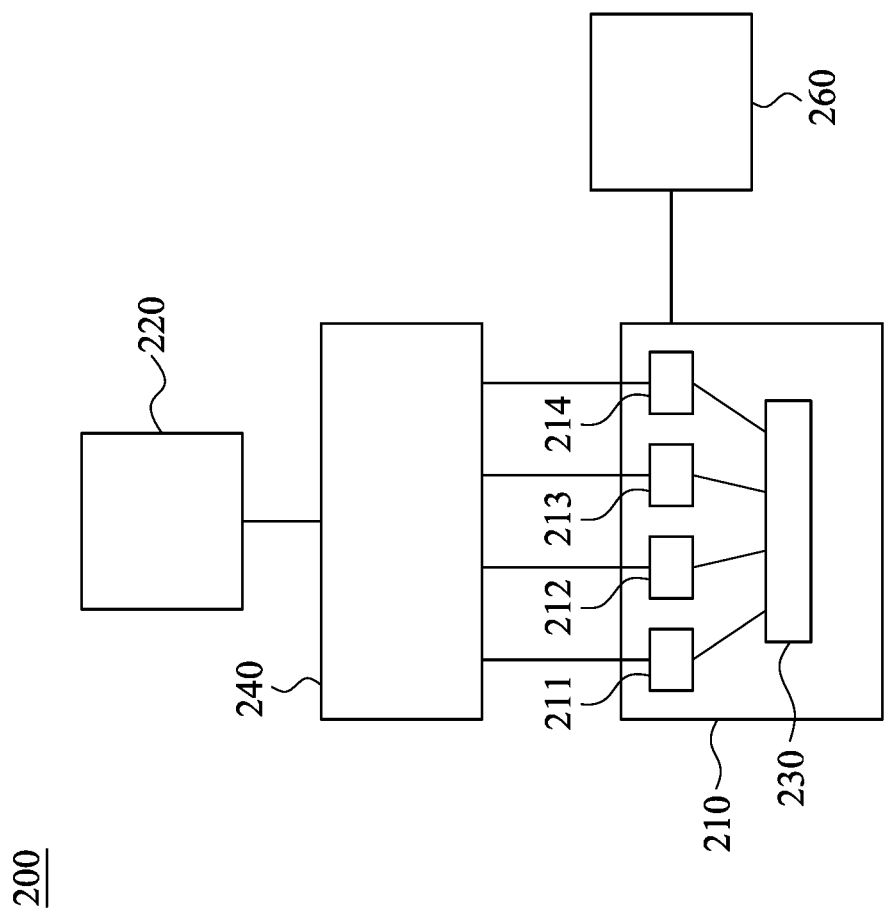
FIG. 3 is a schematic diagram of a process system, according to some alternative embodiments of the present disclosure.

Reference is made to FIG. 3. FIG. 3 is a schematic diagram of a process system 200, according to some alternative embodiments of the present disclosure. The process system 200 includes a local controller 210, a master controller 220, a switch 240, a process chamber (e.g., the process chamber 150 as discussed above), and a data analyzing tool 260.

For illustration in FIG. 3, the master controller 220 is coupled to the switch 240. The switch 240 is coupled between the master controller 220 and the local controller 210. The data analyzing tool 260 is coupled to the local controller 210.

With respect to the embodiments in FIG. 1, the master controller 220, the switch 240, the data analyzing tool 260 in the embodiments in FIG. 3 are designed with the substantially similar functions. Therefore, the description of the master controller 220, the switch 240, and the data analyzing tool 260 will not be elaborated again to avoid redundancy.

In some embodiments, the local controller 210 includes sub local controllers 211-214 and a data storage 230. For illustration in FIG. 3, each of the sub local controllers 211-214 is coupled to the data storage 230. The data storage 230 is configured inside the local controller 210, and cooperates with the sub local controllers 211-214.

For illustration of FIG. 3, in write operation, when the local controller 210 receives the data generated from the process chamber, the local controller 210 writes the received data through at least one of the sub local controllers 211-214 into the data storage 230. In read operation, when the data is to be analyzed by the data analyzing tool 260, the local controller 210 reads the data stored in the data storage 230, and outputs the data to the data analyzing tool 260. With the data storage 230 being configured inside the local controller 210, the local controller 210 is able to access the data through at least one of the sub local controllers 211-214 without occupying the transmission bandwidth of the switch 240.

In some embodiments, the local controller 210 is configured to receive the data generated from the process chamber in a light generation process. In some embodiments, the light generated in the process chamber includes EUV light, DUV light, NIR light, MWIR light, LWIR light, or the combination thereof, as discussed above.

For another illustration, when the master controller 220 reads the data stored in the data storage 230, the master controller 220 accesses the data through the switch 240, which occupies the transmission bandwidth of at least one of the paths of the switch 240. When the local controller 210 reads the data stored in the data storage 230, the local controller 210 accesses the data through at least one of the sub local controllers 211-214. The read operation of the local controller 210 is performed inside the local controller 210, and the data transmission path is located inside the local controller 210. Alternatively stated, the local controller 210 reads the data stored in the data storage 230 without occupying the transmission bandwidth of the switch 240.

The above configuration of process system 200 is given for illustrative purposes. Various configurations of the process system 200 are within the contemplated scope of the present disclosure. For example, in various embodiments, the data analyzing tool 260 is also implemented inside the local controller 210.

Figure 4:
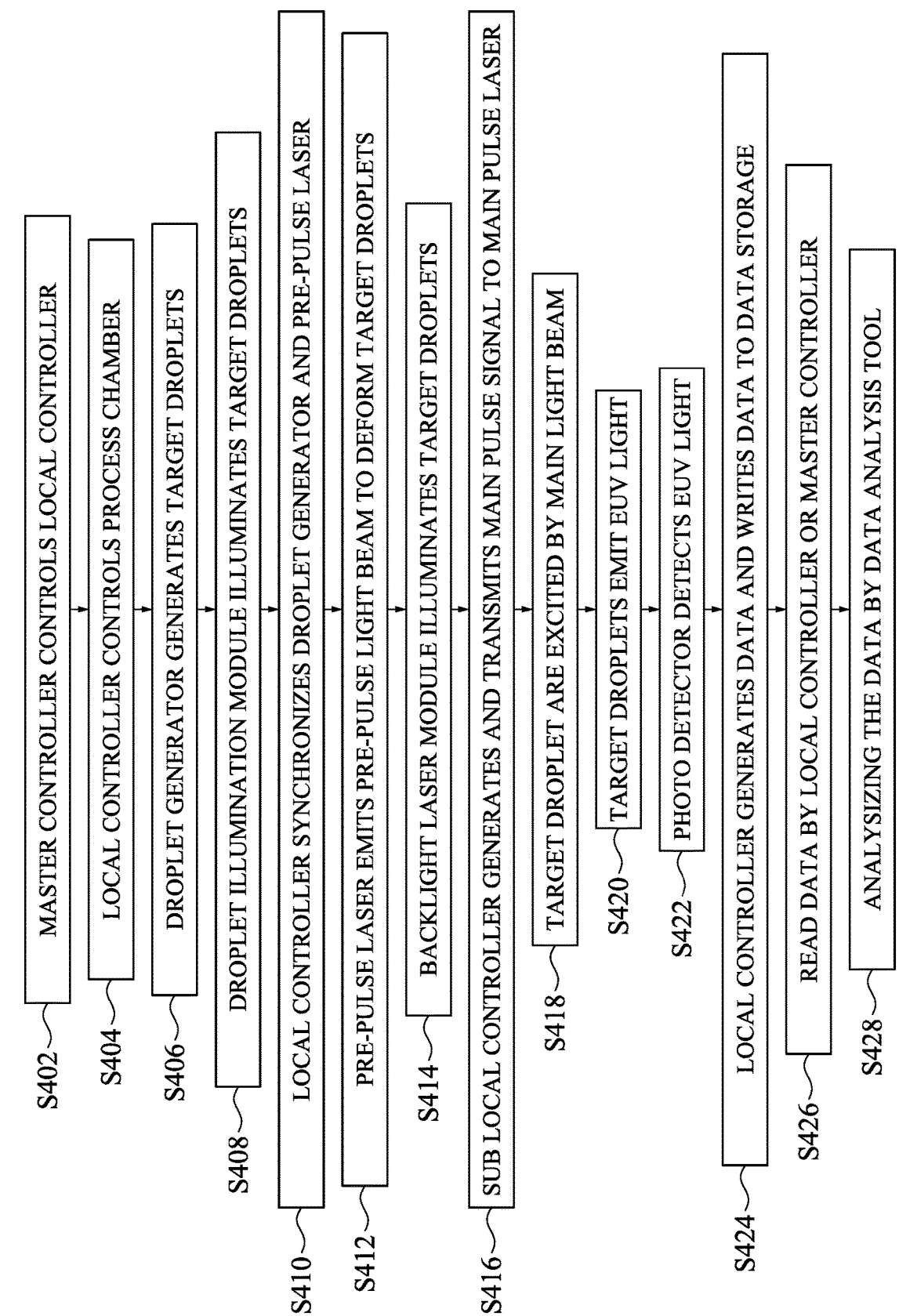
FIG. 4 is a flow chart of a method of operating the process system in FIG. 1 and process chamber in FIG. 2, according to some embodiments of the present disclosure.

Reference is made to FIG. 4. FIG. 4 is a flow chart of a method 400 of operating the process system 100 in FIG. 1 and the process chamber in FIG. 2, according to some embodiments of the present disclosure. Method 400 includes operations S402-S428. For ease of understanding, the method 400 is explained below with reference to FIGS. 1-2.

In operation S402, the master controller 120 of the process system 100 controls the local controller 110. The master controller 120 sends the commands to the local controller 110 through at least one of the paths in the switch 140. The sub local controllers 111-114 in the local controller 110 receive the commands from the master controller 120 through the paths of the switch 140 respectively.

In operation S404, the local controller 110 controls the process chamber 150 according to the commands sent from the master controller 120. The local controller 110 sends the signals to the process chamber 150. The process chamber 150 receives the signals transmitted from the local controller 110 and starts to perform the light generation process according to the signals received from the local controller 110.

In operation S406, the droplet generator 151 in the process chamber 150 generates the droplets toward the droplet collector 152 through the locations LA, LB, and LC. The droplet generator 151 generates the droplets in a frequency of 50 kHz.

In operation S408, the droplet illumination module 153 illuminates the target droplet DP2 at location LB. The droplet illumination module 153 generates the first light beam and the second light beam to the target droplet DP2 at location LB, and the first light beam and the second light beam reflects as the first flash and the second flash to the droplet detection module 154. The droplet detection module 154 detects the first flash and the second flash reflected from the target droplet DP2 to generate and transmits the signal to the sub local controller 111 in the local controller 110.

In operation S410, the local controller 110 synchronizes the pre-pulse laser 155 and the droplet generator 151 according to the signal generated by the droplet detection module 154 in the operation S408. The local controller 110 generates the fire signal $S_{TF}$ according to the signal transmitted from the droplet detection module 154 to the sub local controller 111. The sub local controller 111 generates the pre-pulse signal $S_{PP}$ to the pre-pulse laser 155 according to the fire signal $S_{TF}$. The fire signal $S_{TF}$ includes the information of the locations, the moving traces, and the speed of the droplets in the process chamber 150. Therefore, the pre-pulse laser 155 and the droplet generator 151 are synchronized by the local controller 110 according to the fire signal $S_{TF}$.

In operation S412, the pre-pulse laser 155 emits the pre-pulse light beam to deform the target droplet DP3 at the location LC according to the pre-pulse signal $S_{PP}$. The target droplet DP3 is deformed to the pancake-like shape by the pre-pulse light beam.

In operation S414, the backlight laser module 156 illuminates the deformed droplets, and thus the droplet formation camera 157 is able to detect the shape of the deformed droplets by illuminated by the backlight laser module 156. The droplet formation camera 157 generates a signal to the local controller 110 to indicate the shape and the orientation of the deformed droplets.

In operation S416, the sub local controller 111 generates and transmits the main pulse signal $S_{MP}$ to the main pulse laser 158 according to the fire signal $S_{TF}$. The main pulse laser 158 emits the main light beam to strike the deformed target droplet DP1 at the location LA according the main pulse signal $S_{MP}$. Therefore, emitting the main light beam by the main pulse laser 158 is according to the fire signal $S_{TF}$.

The main pulse laser 158 is synchronized by the local controller 110 according the fire signal $S_{TF}$ generated in the operation S410.

In operation S418, the deformed droplets are excited to the plasma state due to striking by the main light beam. The deformed droplets are stimulated by the energy of the main light beam. The plasma state is related to the energy of the main light beam and the structures and the material of the droplets.

In operation S420, the droplets with the plasma state emits light. The spectrum of the emitted light includes the EUV light. The spectrum of the emitted light also includes DUV light, NIR light, MWIR light, LWIR light, or the combination thereof.

In operation S422, the photo detector 159 detects the EUV light emitted from the droplets with the plasma state. The photo detector 159 generates the feedback signal $S_{FB}$ to the local controller 110 to indicate the EUV light parameters, including pulse energy, spectrum, energy within a particular band of wavelengths, energy outside of a particular band of wavelengths, angular distribution of EUV light intensity, average power, or the combination thereof.

In operation S424, when in the write operation, the local controller 110 receives the feedback signal $S_{FB}$ and generates data signal $S_{DATA}$ according to the feedback signal $S_{FB}$. The local controller 110 then writes the data signal $S_{DATA}$ into the data storage 130. The data storage 130 is directly connected to the local controller 110, and thus the write operation is not performed through the switch 140.

In operation S426, when in the read operation, the data stored in the data storage 130 is read by the local controller 110 and/or the master controller 120. The master controller 120 accesses the data stored in the data storage through the switch 140 and the local controller 110. The local controller 110 accesses the data stored in the data storage 130 without data transmission through the switch 140. Thus the read operation performed by the local controller 110 does not occupy the bandwidth of the switch 140. The read operation performed by the master controller 120, relatively speaking, occupies the bandwidth of the switch 140.

In operation S428, the data analyzing tool 160 reads the data stored in the data storage 130, and performs automatic droplet optimization, real time plotting, hybrid waveform optimization, or the combination thereof according to the data read from the data storage 130. The data analyzing tool 160 reads the data stored in the data storage 130 without through the switch 140. Thus the operations performed by the data analyzing tool 160 do not occupy the bandwidth of the switch 140.

In some approaches, when the data signal $S_{DATA}$ is written into the data storage 130, the transmission bandwidth of the switch 140 is occupied by the write operation. Therefore, the data transmission through the switch 140 is associated with the bandwidth of the switch 140. When the transmission bandwidth of the switch 140 is full or overloaded, the local controller 110 has a chance to be hang-up. Alternatively stated, the local controller 110 will be out of function when the transmission bandwidth of the switch is full or overloaded. Accordingly, in such approaches, the process system 100 cannot perform multi functions when the transmission bandwidth of the switch 140 is full or overloaded.

Compared to the above approaches, in the embodiments of the present disclosure, the write operation and the read operation are performed without occupying the transmission bandwidth of the switch 140. Therefore, the local controller 110 is able to read/write the data in the data storage 130 and communicate with the master controller 120 at the same time without overloading the transmission bandwidth of the switch 140. Alternatively states, the read/write operations are independent from the bandwidth of the switch 140. The working loading of the switch 140 is alleviated by connecting the data storage directly to the local controller 110. Hence, the process system 100 is more stable.

The above illustrations include exemplary operations, but the operations are not necessarily performed in the order shown. Operations may be added, replaced, changed order, and/or eliminated as appropriate, in accordance with the spirit and scope of various embodiments of the present disclosure. For example, in various embodiments, the operations S426 and S428 are able to be operated in parallel with operations S402-S424.

In some embodiments, a device is disclosed that includes a master controller, a process chamber, a local controller, a switch, and a data storage. The process chamber is configured to perform an extreme ultraviolet (EUV) light generation process and generate data associated with the EUV light generation process. The local controller is coupled to the master controller and configured to control the process chamber. The switch is coupled between the master controller and the local controller, wherein the switch is configured to provide paths for the local controller to communicate with the master controller. The data storage directly connected to the local controller and configured to store the data. The local controller communicates directly with the data storage.

Also disclosed is that a method includes controlling, by a master controller, a local controller through a switch, generating, by a process chamber, a data according to a EUV light generation process to the local controller, and writing, by the local controller, the data to a data storage, wherein writing the data to the data storage is independent from the switch.

Also disclosed is that a method includes generating, by a target droplet generator, target droplets in a first rate, deforming, by a pre-pulse laser, the target droplets, stimulating, by a main pulse laser, the target droplets to emit a EUV light, receiving, by a photo detector, the EUV light, generating, by the photo detector, data according to the EUV light, transmitting the data to a local controller controlled by a master controller through a switch, and writing, by the local controller, the data to a data storage, wherein writing the data is isolated from the switch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
   a master controller;
   a process chamber configured to perform an extreme ultraviolet (EUV) light generation process and generate data associated with the EUV light generation process, wherein the process chamber comprises:
   a target droplet generator configured to generate target droplets;
   a droplet illumination module configured to generate a first light beam and a second light beam to the target droplets, wherein an output power of the second light beam is higher than an output power of the first light beam, and a wavelength of the second light beam is longer than a wavelength of the first light beam;
   a pre-pulse laser configured to generate a pre-pulse light beam; and
   a main pulse laser configured to generate a main-pulse light beam, wherein the pre-pulse laser and the main pulse laser are different from the droplet illumination module;
   a local controller coupled to the master controller and configured to control the process chamber;
   a switch coupled between the master controller and the local controller, wherein the switch is configured to provide a plurality of paths for the local controller to communicate with the master controller, and the master controller is configured to control the local controller through the switch; and
   a data storage directly connected to the local controller and configured to store the data,
   wherein the local controller controlled by the master controller is configured to communicate directly with the data storage and the process chamber,
   wherein the local controller is configured to synchronize the target droplet generator and the pre-pulse laser according to the first light beam and the second light beam.

2. The system of claim 1, wherein the process chamber further comprises:
   a target catcher configured to catch the target droplets;
   a droplet detection module configured to measure a location of the target droplets cooperating with the droplet illumination module;
   a backlight laser module;
   a droplet formation camera configured to detect a shape of the target droplets cooperating with the backlight laser module,
   wherein the pre-pulse laser is configured to deform the target droplets,
   wherein the main pulse laser is configured to irradiate the target droplets to generate a EUV light; and
   a photo detector configured to generate the data according to the EUV light and transmit the data to the local controller.

3. The system of claim 1, wherein the local controller is configured to generate a fire signal according to location information of the target droplets to synchronize the target droplet generator and the pre-pulse laser.

4. The system of claim 1, wherein the local controller is configured to generate a fire signal according to a signal transmitted from a droplet detection module in the process chamber to the local controller to synchronize the target droplet generator and the pre-pulse laser.

5. A method, comprising:
   controlling, by a master controller, a local controller through a switch;
   generating, by a target droplet generator in a process chamber, target droplets;
   generating, by a droplet illumination module in the process chamber, a first light beam and a second light beam to the target droplets, wherein an output power of the second light beam is higher than an output power of the first light beam, and a wavelength of the second light beam is longer than a wavelength of the first light beam;

generating, by a pre-pulse laser and a main pulse laser in the process chamber, a pre-pulse light beam and a main-pulse light beam respectively, wherein the pre-pulse laser and the main pulse laser are different from the droplet illumination module, synchronizing, by the local controller, the target droplet generator and the pre-pulse laser according to the first light beam and the second light beam;

generating, by the process chamber, a data according to a feedback signal of a EUV light generation process to the local controller, wherein the feedback signal indicates errors in parameters associated with timing and focus of the pre-pulse light beam and the main-pulse light beam;

writing, by the local controller, the data to a data storage, wherein writing the data to the data storage is independent from the switch; and communicating, by the local controller controlled by the master controller, directly with the process chamber.

6. The method of claim 5, wherein generating the data comprises:
deforming, by the pre-pulse laser, the target droplets;
after deforming the target droplets, generating, by the main pulse laser, a EUV light; and
receiving, by a photo detector, the EUV light to generate the data.

7. The method of claim 6, wherein generating the data further comprises:
locating, by the droplet illumination module and a droplet detection module, the target droplets; and
identifying, by a backlight laser module and a droplet formation camera, a shape of the target droplets.

8. The method of claim 6, wherein generating the EUV light comprises:
irradiating the target droplets to generate a plasma; and
emitting the EUV light according a conversion process of the plasma.

9. The method of claim 5, further comprising:
the switch providing a plurality of paths for the local controller to communicate with the master controller while the local controller communicating directly with the data storage.

10. The method of claim 6, further comprising:
synchronizing the target droplet generator, the pre-pulse laser, and the main pulse laser by the local controller according to a fire signal.

11. A method, comprising:
generating, by a target droplet generator, target droplets in a first rate;
generating, by a droplet illumination module, a first light beam and a second light beam to target droplets, wherein an output power of the second light beam is higher than an output power of the first light beam, and a wavelength of the second light beam is longer than a wavelength of the first light beam;
deforming, by a pre-pulse laser, the target droplets;

stimulating, by a main pulse laser, the target droplets to emit a EUV light, wherein the pre-pulse laser and the main pulse laser are different from the droplet illumination module;

receiving, by a photo detector, the EUV light to generate a feedback signal;

generating, by the photo detector, data in response to the feedback signal, wherein the feedback signal indicates errors in parameters associated with timing and focus of a pre-pulse light beam of the pre-pulse laser and a main-pulse light beam of the main pulse laser;

controlling, by a master controller, a local controller through a switch;

transmitting the data to the local controller controlled by the master controller through the switch;

writing, by the local controller, the data to a data storage, wherein writing the data is performed without the switch; and communicating, by the local controller controlled by the master controller, directly with the main pulse laser.

12. The method of claim 11, further comprising:
before deforming the target droplets, illuminating, by the droplet illumination module, the target droplets; and
estimating, by a droplet detection module, a moving trace of the target droplets.

13. The method of the claim 12, further comprising:
synchronizing the target droplet generator, the pre-pulse laser, and the main pulse laser by the local controller.

14. The method of claim 11, further comprising:
reading, by the local controller, the data from the data storage, wherein reading the data is isolated from the switch.

15. The method of claim 11, further comprising:
performing a lithography process by the EUV light.

16. The method of claim 11, further comprising:
after deforming the target droplets, illuminating, by a backlight laser module, the target droplets; and
detecting, by a droplet formation camera, a shape of the target droplets.

17. The method of claim 11, further comprising:
the switch providing a plurality of paths for the local controller to communicate with the master controller while the local controller communicating directly with the data storage.

18. The method of claim 13, further comprising:
synchronizing the target droplet generator, the pre-pulse laser, and the main pulse laser by the local controller according to a fire signal.

19. The method of claim 18, wherein the local controller is configured to generate the fire signal according to location information of the target droplets.

20. The method of claim 18, wherein the local controller is configured to generate the fire signal according to a signal transmitted from the droplet detection module to the local controller.

* * * * *